United States Patent
Coulson et al.

(10) Patent No.: US 8,291,297 B2
(45) Date of Patent: Oct. 16, 2012

(54) DATA ERROR RECOVERY IN NON-VOLATILE MEMORY

(75) Inventors: Richard Coulson, Portland, OR (US);
Albert Fazio, Saratoga, CA (US);
Jawad Khan, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 945 days.

(21) Appl. No.: 12/316,986

(22) Filed: Dec. 18, 2008

(65) Prior Publication Data

US 2010/0162084 A1    Jun. 24, 2010

(51) Int. Cl.
*G11C 29/00* (2006.01)
(52) U.S. Cl. ........................... 714/764; 714/765
(58) Field of Classification Search .................. 714/764, 714/765; 365/185.09
See application file for complete search history.

(56) References Cited

U.S. PATENT DOCUMENTS

| | | | |
|---|---|---|---|
| 6,542,407 B1 * | 4/2003 | Chen et al. | 365/185.17 |
| 6,674,385 B2 * | 1/2004 | Micheloni et al. | 341/155 |
| 6,862,218 B2 * | 3/2005 | Guterman et al. | 365/185.24 |
| 6,944,063 B2 * | 9/2005 | Chen et al. | 365/185.33 |
| 7,099,190 B2 * | 8/2006 | Noguchi et al. | 365/185.09 |
| 7,231,585 B2 * | 6/2007 | Vainsencher et al. | 714/784 |
| 7,369,434 B2 * | 5/2008 | Radke | 365/185.03 |
| 7,567,461 B2 * | 7/2009 | Roohparvar | 365/185.19 |
| 7,568,135 B2 * | 7/2009 | Cornwell et al. | 714/721 |
| 7,616,495 B2 * | 11/2009 | Mokhlesi | 365/185.19 |
| 7,844,879 B2 * | 11/2010 | Ramamoorthy et al. | 714/763 |
| 7,876,621 B2 * | 1/2011 | Sharon et al. | 365/185.24 |
| 7,877,564 B2 * | 1/2011 | Eldredge et al. | 711/163 |
| 7,904,788 B2 * | 3/2011 | Brandman et al. | 714/760 |
| 7,904,793 B2 * | 3/2011 | Mokhlesi et al. | 714/780 |
| 7,966,550 B2 * | 6/2011 | Mokhlesi et al. | 714/780 |
| 8,004,895 B2 * | 8/2011 | Gonzalez et al. | 365/185.11 |
| 8,050,086 B2 * | 11/2011 | Shalvi et al. | 365/185.02 |
| 2004/0008562 A1 | 1/2004 | Ito et al. | |
| 2006/0133141 A1 | 6/2006 | Gorobets | |
| 2007/0171714 A1 * | 7/2007 | Wu et al. | 365/185.09 |
| 2007/0211532 A1 | 9/2007 | Gonzalez et al. | |
| 2008/0034272 A1 * | 2/2008 | Wu et al. | 714/763 |
| 2008/0123419 A1 | 5/2008 | Brandman et al. | |

(Continued)

FOREIGN PATENT DOCUMENTS

JP    2006-318132 A    11/2006

(Continued)

OTHER PUBLICATIONS

Chun Fung Man et al., Using Error Information From Nearby Locations to Recover Uncorrectable Data in Non-Volatile Memory, pending U.S. Appl. No. 12/283,861, Filed Sep. 16, 2008.

(Continued)

*Primary Examiner* — Stephen M Baker
(74) *Attorney, Agent, or Firm* — Kacvinsky Daisak, PLLC (57) ABSTRACT

When an error correction code (ECC) unit finds uncorrectable errors in a solid state non-volatile memory device, a process may be used in an attempt to locate and correct the errors. This process may first identify 'low confidence' memory cells that are likely to contain errors, and then determine what data is more likely to be correct in those cells, based on various criteria. The new data may then be checked with the ECC unit to verify that it is sufficiently correct for the ECC unit to correct any remaining errors.

17 Claims, 7 Drawing Sheets

U.S. PATENT DOCUMENTS

| | | |
|---|---|---|
| 2008/0195916 A1 | 8/2008 | Lee et al. |
| 2008/0198650 A1 | 8/2008 | Shalvi et al. |
| 2008/0244349 A1* | 10/2008 | Sukegawa ............... 714/746 |
| 2008/0244360 A1 | 10/2008 | Mokhlesi et al. |
| 2009/0013231 A1* | 1/2009 | Lam ....................... 714/746 |

FOREIGN PATENT DOCUMENTS

| | | |
|---|---|---|
| WO | 2010/080257 A2 | 7/2010 |
| WO | 2010/080257 A3 | 9/2010 |

OTHER PUBLICATIONS

International Search Report/Written Opinion for PCT Patent Application No. PCT/US2009/066612, mailed Jul. 5, 2010, 8 pages.

International Preliminary Report on Patentability received for the PCT Application No. PCT/US2009/066612, issuance on Jun. 21, 2011, 4 pages.

European Search Report received for European Application 09837801.1, mailed Jun. 14, 2012, 3 pgs.

* cited by examiner

DATA ERROR RECOVERY IN NON-VOLATILE MEMORY

BACKGROUND

Some types of solid state non-volatile memory, such as flash memory, record binary data by storing a certain amount of electrical charge in a memory cell. When the data is read from one of these charge-based non-volatile memories, the voltage level of the stored charge is compared to a reference voltage. The binary value of the data read from that cell depends on whether the voltage of the stored charge is higher or lower than the reference voltage. However, since the stored charge is an analog phenomenon, its actual value may not be exactly what was intended, and errors may be encountered when the data is read. Error correcting code (ECC) units may be used to detect and correct some of these errors, but sometimes the errors are too numerous to all be corrected in this manner. When this happens, the data may be permanently lost.

BRIEF DESCRIPTION OF THE DRAWINGS

Some embodiments of the invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

Various embodiments of the invention may be implemented in one or any combination of hardware, firmware, and software. The invention may also be implemented as instructions contained in or on a computer-readable medium, which may be read and executed by one or more processors to enable performance of the operations described herein. A computer-readable medium may include any mechanism for storing, transmitting, and/or receiving information in a form readable by one or more computers. For example, a computer-readable medium may include a tangible storage medium, such as but not limited to read only memory (ROM); random access memory (RAM); magnetic disk storage media; optical storage media; a flash memory device, etc. A computer-readable medium may also include a propagated signal which has been modulated to encode the instructions, such as but not limited to electromagnetic, optical, or acoustical carrier wave signals.

In various embodiments, if uncorrectable errors are found when reading data from a portion of charge-based non-volatile memory, a process may be followed to attempt to correct the data. Since the exact location of the bad data may not be known, this process may comprise 1) identifying 'low confidence' (LC) storage cells in that portion of memory (i.e., cells that are more likely than other cells to contains errors), 2) determining what data in those cells is likely to be correct, and 3) verifying that the new data is correct. Identifying low confidence cells may be done in either of two ways: 1) find cells whose analog charge voltage is close to a reference voltage, or 2) look for particular patterns of charge levels in the surrounding cells that are known to cause data corruption in a target cell. Determining new data that is likely to be correct in the low confidence cells may be done in either of two ways: 1) adjust the analog charge value in those cells in a direction and amount that seems best, or 2) try random values of data in the LC cells. Verifying that the new data is correct may be performed in any suitable manner, but may typically be done by using an error checking and correction (ECC) algorithm, since this will produce valid data as long as the number of errors is below a certain threshold. Once the correct values of the data have been determined, the data may be re-written to another location, where it hopefully will not experience the same problems of data corruption. Although computationally intensive, this process may be useful for recovering data that is otherwise impractical to recover in other ways, such as data in a solid state disc (SSD) that contains fatal errors in important data.

Figure 1:
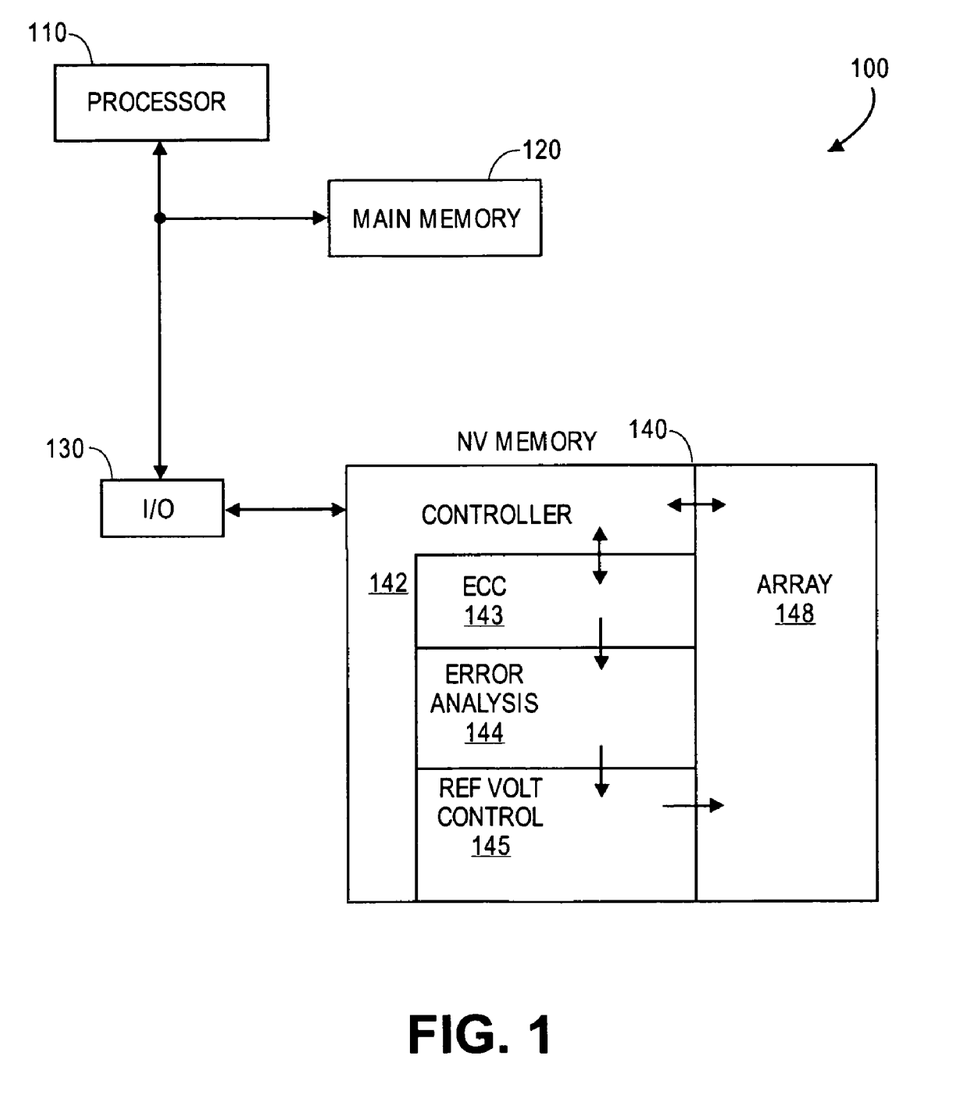
FIG. 1 shows a system containing a solid state non-volatile memory, according to an embodiment of the invention.

FIG. 1 shows a system containing a solid state non-volatile memory, according to an embodiment of the invention. The illustrated system 100 comprises a processor 110, a main memory 120, input-output logic 130, and a non-volatile (NV) memory 140. In this particular implementation, the NV memory is attached as an I/O device (such as but not limited to a solid-state disk), but other embodiments may place the NV memory elsewhere in the system, such as but not limited to a part of the main memory itself, a cache memory working in cooperation a hard disk drive, etc. Various embodiments of the invention should be usable in diverse applications, and in different parts of a system, whether or not those applications and parts are specifically described here.

The NV memory may employ any feasible type of NV storage technology that uses stored charge to store data, and uses one or more reference voltages for read operations. It may be particularly useful in NV memory that reads an entire range of sequential memory locations with a single read command (such as but not limited to reading a page of memory from a NAND flash memory array), rather than reading an individual byte or word with a single read command.

In the illustrated embodiment of FIG. 1, NV memory 140 may comprise a storage array 148 and a controller 142 to control operations with the array such as read, write, erase, and adjustment of reference voltages. The controller 142 may be further separated into other functional units, such as error checking and correction (ECC) unit 143, error analysis unit 144, and reference voltage control unit 145. The reference voltage control unit 145 may provide each of the one or more reference voltages used when reading data from the memory cells in the array. The reference voltage control unit 145 may also adjust these reference voltages up and/or down as needed to perform the operations described herein. Although the various units in NV memory 140 are shown as separate functional units, two or more of them may share common circuitry and/or code.

Whenever the controller 142 receives a read request from the processor 110 or other device, the controller 142 may initiate an operation that reads data from multiple sequential locations in the memory array. The starting address of the locations may be indicated by the read request, while the number of locations may be specified in the request or may be predefined in some other manner. As the data is read and placed in a buffer, the ECC unit may detect errors in the data, keep track of those errors, and correct the errors that it is able to correct through its error-correction algorithm. When non-correctable errors (i.e., not correctable by the ECC unit) are detected in this manner, the data from an entire range of sequential addresses (e.g., a page or a sector of memory) may be designated as being incorrect, since the quantity and location of the uncorrectable errors within that range are unknown.

Figure 2:
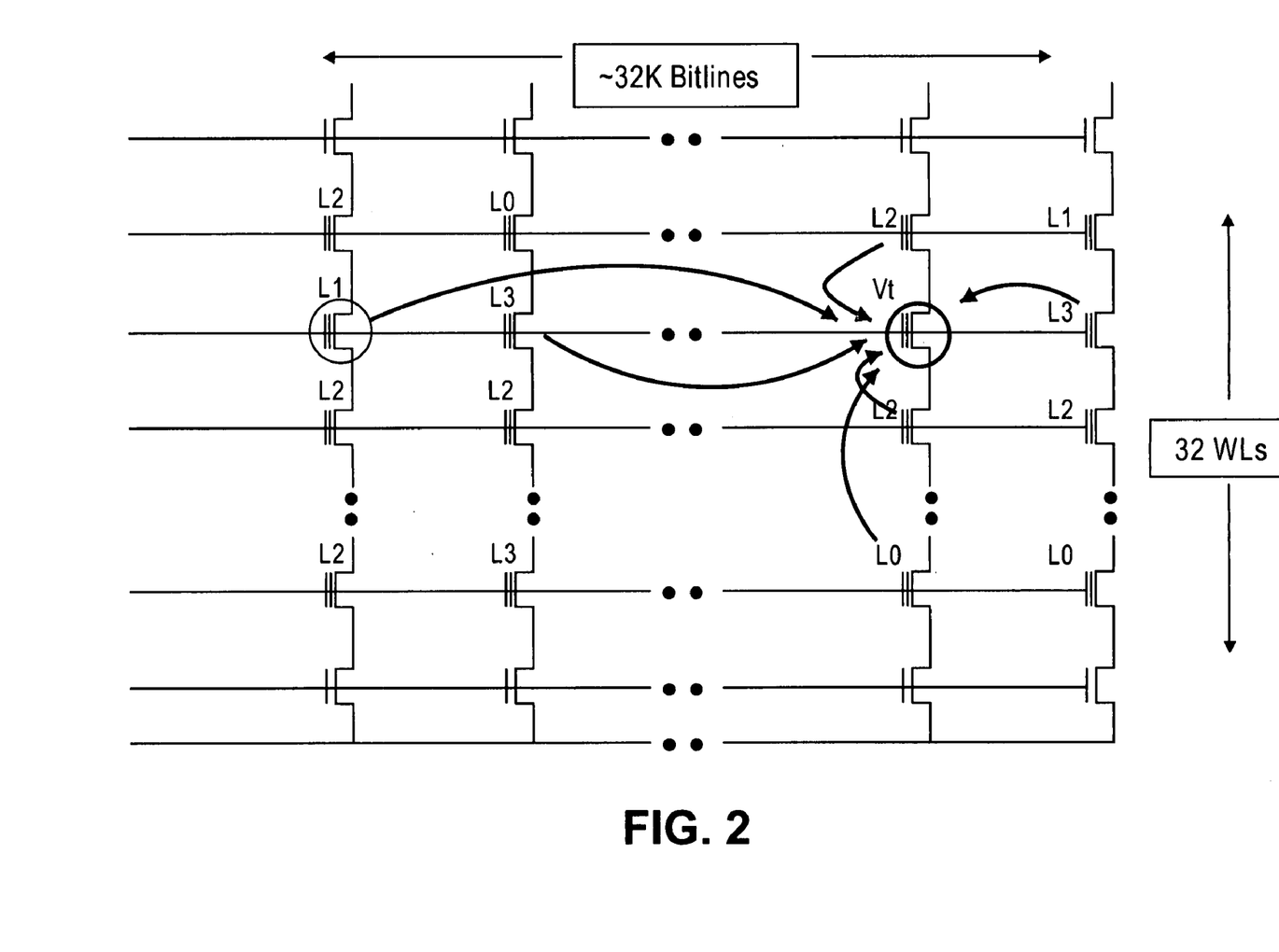
FIG. 2 shows a portion of a non-volatile memory array, according to an embodiment of the invention.

FIG. 2 shows a portion of a non-volatile memory array, according to an embodiment of the invention. The illustrated example shows a common representation of a flash memory array, in which each transistor represents a memory cell in which the amount of stored charge near the gate represents the data stored in that cell. Types of memory other than flash memory, and circuits other than the one shown, may also be included in the various embodiments of the invention. In the particular example shown, each of the horizontal lines represents a word line connecting the gates of multiple cells in that row (in this example approximately 32 thousand cells, but that number may differ in other embodiments), while the cells in each bit line column are connected to each of the adjacent cells in that column. The cells may represent single level cell (SLC) or multilevel cell (MLC) technology. As the terms are used in this document, SLC refers to technology that stores only one bit per cell, while MLC refers to technology that stores two or more bits per cell. The illustrated array represents a four-level MLC technology, where the range of possible charge is divided into four sub-ranges, labeled L0 through L3, and each sub-range represents a different 2-bit combination (e.g., 11, 10, 00, or 01). If the charge in a particular cell falls within one of those four sub-ranges, the cell is considered to be storing the corresponding 2-bit binary value. Example values for 15 of the cells are given, with an unknown charge Vt on a $16^{th}$ cell.

For the following discussions, it is assumed that an ECC or other type of error detection and correction algorithm has been used, but it cannot correct all the errors in a given range of sequential memory addresses. In such cases, it is known that the errors are contained within this range, but it is not known exactly which addresses (and therefore which cells) contain the errors. In many cases it is not known how many errors there are, except that the number of errors exceeds the ability of the ECC to correct them all. For this discussion, it is assumed that the entire page is considered to be 'failed' because the ECC unit could not correct all the errors in that page, but units other than a page (e.g., a sector) may also be examined in this manner if the ECC code block size renders the failed unit a different size than a page. The following definitions are used in this document:

1) analog charge value—a value that represents the voltage for the charge stored in a particular cell. Although this value may be expressed as a discrete digital or binary number for processing, it represents the analog charge value and is therefore labeled as an analog value.

2) charge level value—a value that represents one of the sub-ranges of charge level in the cell, in which each sub-range represents a different binary data value. For example, in a four-level MLC, a charge level value of 0 may represent the lowest sub-range (least amount of charge), 1 the next higher sub-range, 2 the next higher sub-range, and 3 the highest sub-range (greatest amount of charge).

3) binary data value—the binary value of the data that is being stored in a cell. For example, in a four-level MLC, a binary 11 may be represented by charge level value of 0, a binary 10 may be represented by a charge level value of 1, a binary 00 may be represented by a charge level value of 2, and a binary 01 may be represented by a charge level value of 3. These particular conversion values may be advantageous because a transition from one charge level to the next only changes one bit of the equivalent binary value, reducing the uncertainly of a borderline reading to only two possibilities. However, other conversion values may also be used.

Figure 3:
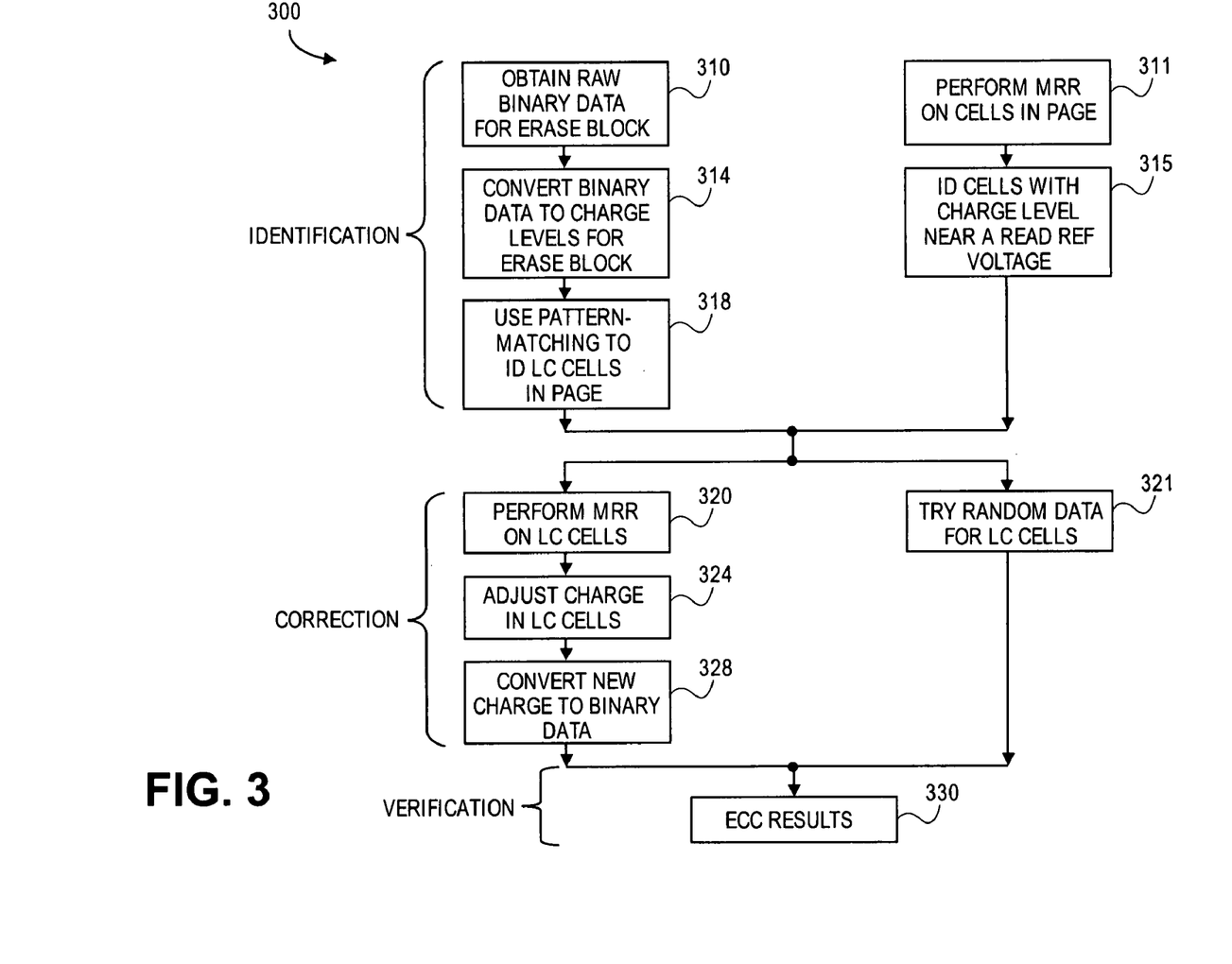
FIG. 3 shows a flow diagram of a method of correcting errors in a memory, according to an embodiment of the invention.

FIG. 3 shows a flow diagram of a method of correcting errors in a memory, according to an embodiment of the invention. In flow diagram 300, operations 310, 314, 318 and operations 311, 315 represent two different ways to identify low confidence (LC) cells in a page of data that is considered failed. Operations 320, 324, 328 and operation 321 represent two different ways to attempt to correct the data in those LC cells. The verification operation at 330 may be the same, regardless of which combination of identification and correction processes are used.

Identification Through Pattern Matching

This process corresponds with operations 310, 314, 318 of FIG. 3. With the ever-smaller geometries used in memory arrays, the amount of charge stored in each cell may be affected by the amount of charge stored in the surrounding cells, pulling that charge up or down from what it was intended to be. Referring back to FIG. 2 for an example, the cell with a charge level of Vt is the 'target' cell being investigated by examining the possible effect of the surrounding cells on Vt. Arrows indicate an example of the possible cells whose charge level might affect the charge Vt because of their physical proximity or electrical connection to the target cell. The exact nature of this effect, and the particular cells that might cause it, may depend on the specifics of the array, such as physical closeness of the cells, the cell structure, the semiconductor materials used, the actual charge level in each of the surrounding cells and in the target cell, etc. Such interrelationships may be determined for each type of array, and for each pattern of charge distribution in the cells.

Figure 4:
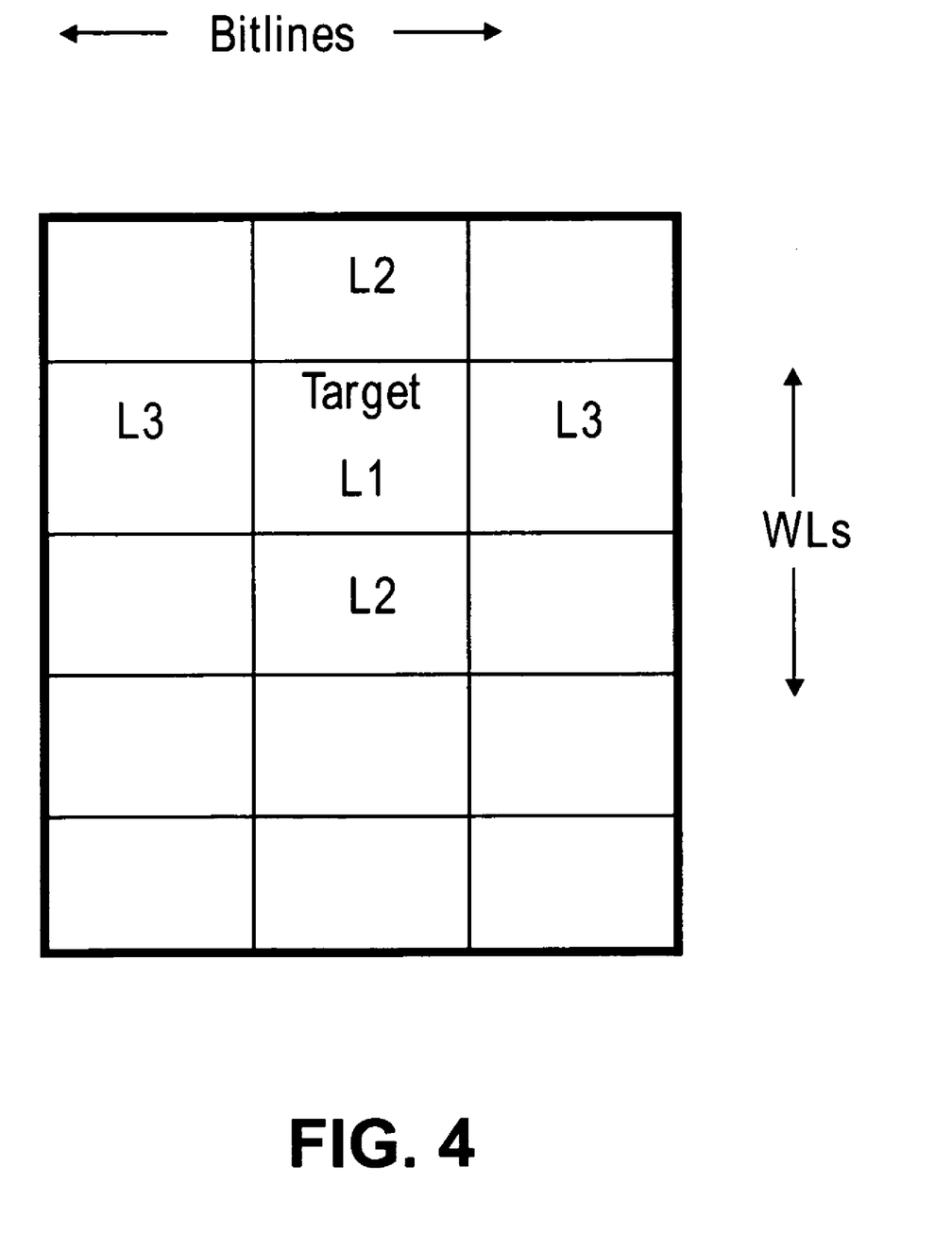
FIG. 4 shows an example charge pattern that may affect a target cell, according to an embodiment of the invention.

FIG. 4 shows an example charge pattern that may affect a target cell, according to an embodiment of the invention. For the purposes of this document, a 'pattern' is a group of cells with a predefined physical arrangement, with predefined electrical connections to each other, and predefined charge levels within those cells. A target cell is a cell that occupies a predefined place within the physical arrangement, and also is the cell that is being examined to determine the possible effect of other cells in the pattern upon it. A particular pattern may be defined based on the charge levels in all the cells in the pattern, including the charge level in the target cell. For example, in FIG. 4 the cells on both sides of the target cell (adjacent cells on the same word line) have a charge level of L3, while the cells immediately above and below the target cell (adjacent cells on the same bit line) have charge level of L2. If the correct charge level in the target cell is supposed to be L0, these surrounding cells might pull that charge in the target cell to an L1 level (as shown), and so having a charge of L1 in the target cell is part of this pattern. On the other hand, if the charge level in the target cell is supposed to be L2 or L3, the charge in the surrounding cells may be close enough to that level that they have little affect on it, and so that arrangement would not be considered a predefined pattern to be searched for. In some embodiments, the charge level for any given cell in the pattern might cover more than one level. Using the pattern of FIG. 4 as an example, any of the four cells adjacent to the target cell might be allowed to have a charge level of either L2 or L3, and that would still be considered as matching the pattern.

This example shows a simple five-cell pattern (the target cell and the adjacent cells on the same word line and bit line) with a specific charge distribution, but other patterns may involve different arrangements of cells around the target cell and/or different quantities of cells and/or different charge distribution in the cells. Although the same set of patterns may be expected to apply to large portions of the array, some patterns may be applicable only to specific portions of the array (e.g., a target cell at the edge of the array would have no adjacent cell on one side, so a different set of patterns might be used for cells at the edge). Because each cell might be examined separately with this pattern-matching technique, a given cell might be considered a target cell in one instance, but be one of the surrounding cells when another cell is being targeted.

Figure 5:
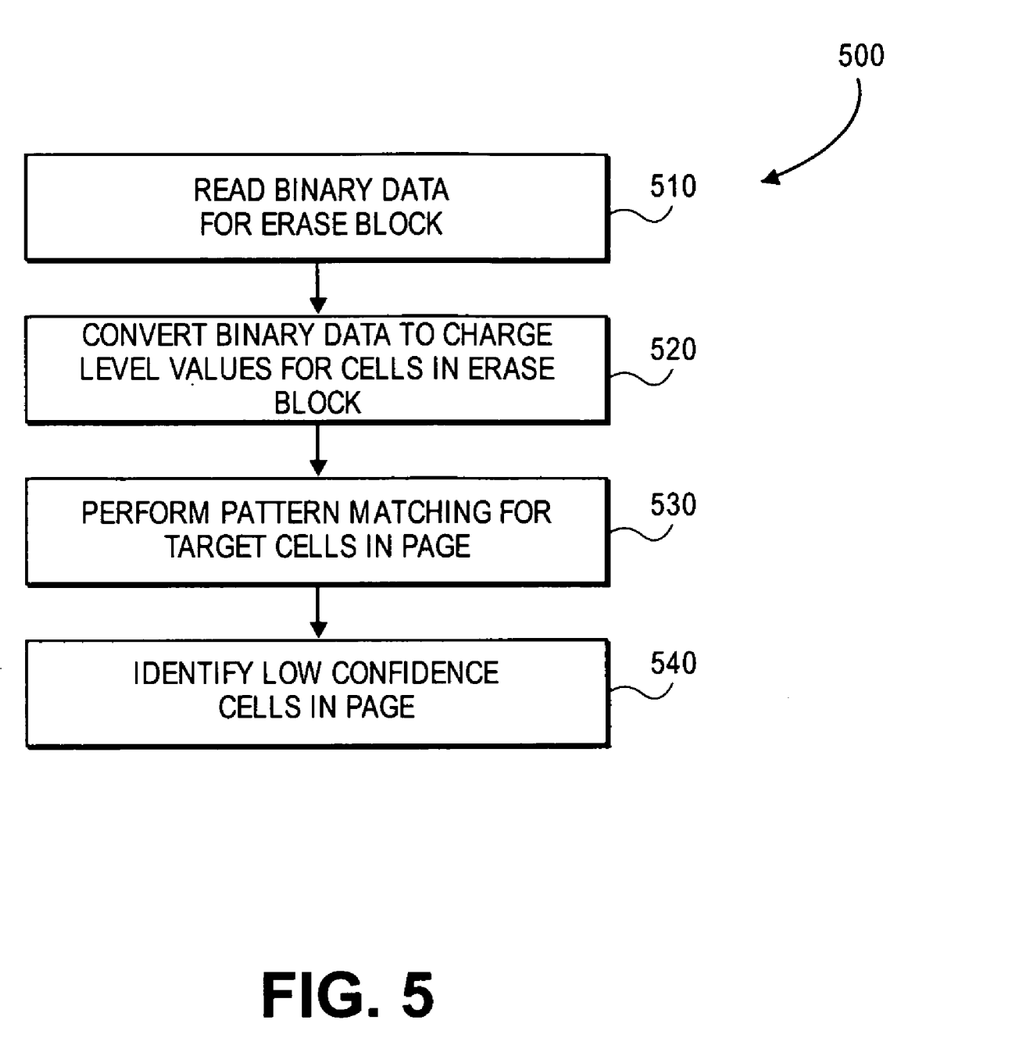
FIG. 5 shows a flow diagram of a method of pattern-matching to identify low-confidence cells in a NV memory array, according to an embodiment of the invention.

FIG. 5 shows a flow diagram of a method of pattern-matching to identify low-confidence cells in a NV memory array, according to an embodiment of the invention. In the described method, it is assumed that a particular page of data in the memory has one or more errors that were uncorrectable by the ECC unit, and that these errors were at least partly caused by the type of charge distribution effects previously described, so that the correct data may be determined by analyzing that charge distribution. For this discussion, it is assumed that an entire page is considered failed because the ECC unit could not correct all the errors in that page, but units other than a page (e.g., a sector) may also be examined in this manner if the ECC code block size renders the failed unit a different size than a page.

In the illustrated flow diagram 500, at 510 the binary data in the entire erase block containing the failed page may be read. Although the entire page is considered 'failed', (because it is known to have errors but the locations of the errors within the page are unknown), it is still possible to read data from all cells in the page, even though some of that data will be incorrect. It may be desirable to read the entire erase block, rather than just the failed page, because of the way that NV memories are typically laid out, which permits cells in the correctly-read pages in the erase block to affect cells in the failed page in the same erase block.

At 520, the binary data read from the erase block may be converted to charge level values. The exact manner of this conversion may depend on how many charge levels (and therefore how many bits of binary data) are contained in each cell, and on how each of those levels indicates a particular binary data value. The results of this conversion may be placed into a charge level map that contains the charge level value for each cell in the erase block. The map may also indicate (e.g., through the organization of the map) how those cells relate to each other, physically and/or electrically, so that they may be grouped together into groups that are meaningful for the subsequent pattern-matching process. One such manner of organization, though not the only manner, is to organize the map into a two-dimensional array that reflects the row and column electrical layout of the cells in the erase block.

At 530 the actual pattern-matching process may be done. The earlier description of FIG. 4 provides one example of this pattern-matching process. Each cell that is a target cell in a matched pattern may be designated a low-confidence cell at 540. Not all cells in the erase block need to be examined for patterns that have that cell as the target cell. Only groups of cells in which the target cell is in the failed page need to be examined for pattern matching. Since pages are frequently assigned to alternating bit lines, this may simplify the pattern matching process. Referring to FIG. 4, the center bit line is in the failed page, but the bit lines to the left and right are in another page which the ECC has shown to contain correct data. So pattern matching does not need to be applied to groups of cells in which the target cell is not in the failed page. This also reduces the chances that another cell in the pattern (other than the target cell) contains incorrect data, since in this example only those cells on the same bit line as the target cell are in the failed page.

Identification through Reference Voltage Proximity

This process corresponds to operations 311, 315 of FIG. 3. When the analog value of the charge stored in a cell is very close to the reference voltage that is used when reading that cell, it is very easy for the voltage of the charge to end up on the wrong side of that reference voltage and produce an incorrect reading. The process of FIG. 6 takes advantage of this phenomenon.

Figure 6:
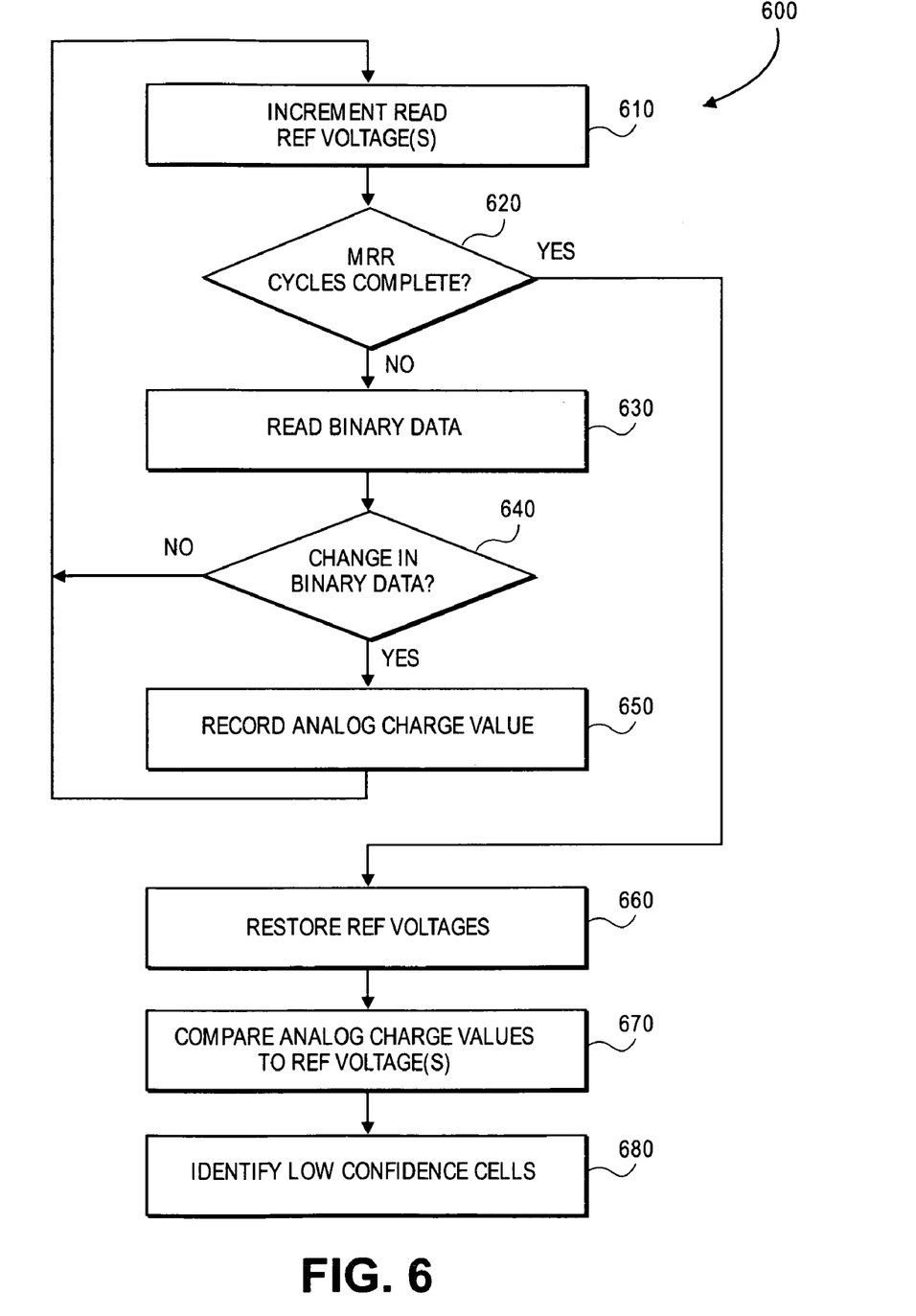
FIG. 6 shows a flow diagram of a method of using proximity to reference voltages as a way to identify low-confidence cells in a NV memory array, according to an embodiment of the invention.

FIG. 6 shows a flow diagram of a method of using proximity to a reference voltage as a way to identify low-confidence cells in a NV memory array, according to an embodiment of the invention. In flow diagram 600, a process referred to herein as a 'moving read reference' (MRR) may be used to measure the analog charge voltage in each cell. At 610, each read reference voltage may be incremented through a range of values. This incremental process may repeatedly cycle through operations 610-650 until the MRR process is complete, as determined at 620. Any feasible technique may be used to increment the reference voltage(s). For multi-level cell technology, in which there are multiple reference voltages, some embodiments may increment only a single reference voltage for each new cycle, while other embodiments may increment multiple reference voltages for each new cycle. Some embodiments may increment all the reference voltages for each new cycle. Some embodiments may switch between these alternatives on difference cycles.

After each increment, the binary value of data stored in each cell in the failed page may be read at 630. If the data read from a given cell is different than it was in the previous pass, as indicated at 640, that indicates that the incremented reference voltage has just crossed over the analog charge value, and the analog charge value must be very close to the reference voltage (within the range of one increment). This value may then be recorded at 650 in a map of analog charge values. This may be performed for every cell that shows changed data from the previous pass. In MLC memories that have multiple reference voltages, the particular before-and-after binary values may need to be examined to determine which reference voltage was crossed, so the proper voltage may be recorded. The process of 610-650 may be repeated until the analog charge values for all the cells in the failed page have been recorded.

If all the incremented values of the reference voltages have been tried, but not all the cells in the page have a recorded value for their analog charge, then the unrecorded cells may have an analog charge value that is outside the tested ranges (in which case the ranges may be expanded for further testing), or the cell has failed completely (in which case other corrective actions, not described here, may be taken). Assuming that all the cells have recorded values, the process may move from operation 620 to operation 660, where the reference voltages may be restored to their original values so that normal read operations may take place.

At this point, the analog charge value that was recorded for each cell may be compared to the restored reference voltages at 670. (The restored values of the reference voltages may be recorded, and the recorded values used in this comparison, so that further accesses to the actual cells will not be necessary.) If any cell has an analog charge value that is close to a restored reference voltage, that cell may be identified at 680 as a low confidence cell. Just how close the analog charge value needs to be to a reference voltage before it is considered 'low confidence' may depend on various factors. In some embodiments the range of analog charge values that are considered 'close' to the reference voltage, and/or the center point of this range, may be changed during processing. For example, a fairly narrow range of voltages may be used at first. If this does not produce satisfactory results, the range may be enlarged in an attempt to include more cells in the 'low confidence' category. Several iterations of these changes may be made before satisfactory results are obtained.

Correction through Charge Adjustment

This process corresponds with operations 320, 324, 328 of FIG. 3. In general, it involves adjusting the analog charge value of a low confidence cell in a manner that is projected to improve the likelihood of getting correct data from the cell.

Figure 7:
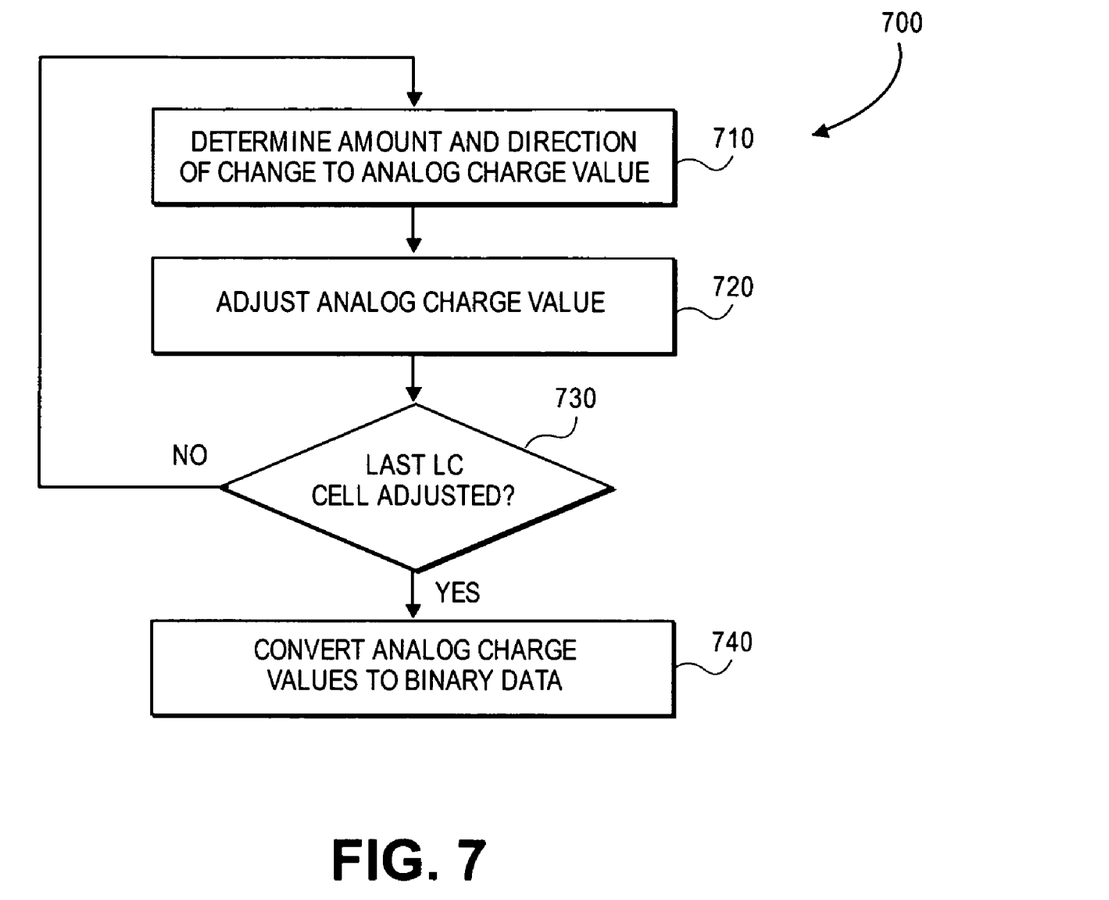
FIG. 7 shows a flow diagram of a method of correcting data in a NV memory through adjustment of analog charge values, according to an embodiment of the invention.

FIG. 7 shows a flow diagram of a method of correcting data in a NV memory through adjustment of analog charge values, according to an embodiment of the invention. To adjust analog charge values for low-confidence cells in the failed page, the starting values of those analog charge values must be known. If the MRR process of operations 610-650 in FIG. 6 has already been performed to identify low confidence cells, then those starting values are already known. If it has not, the MRR process may be performed before starting the method of flow diagram 700.

For each low-confidence cell, at 710 the amount (change the amount of charge, which changes the analog charge value), and the direction (add or subtract charge) of the projected adjustment to the cell may be determined. Any feasible method may be used to determine the direction and amount of this adjustment. At 720, this adjustment may be made to the analog charge value. Rather than changing the actual charge that exists in the physical cell, this process may be performed mathematically on the recorded analog charge values in the analog charge map that was previously constructed for the failed page.

The number of low confidence cells to adjust in this manner before performing a verification may depend on numerous factors. Adjusting all the low confidence cells (or at least a large number of cells) runs the risk of changing previously correct data into bad data, potentially making the problem worse. Adjusting a small number of cells before verification runs the risk of not changing enough bad cells to get a valid ECC result during verification, and thus not knowing if the changes were correct or not. However the number of cells to change might be determined, after that number of cells has been changed, as determined at 730, the process may move to 740 where the new analog charge values for the low confidence cells are converted into their equivalent binary data.

Correction through Random Data Substitution

This process corresponds with operation 321 of FIG. 3. In general, it involves trying random data in the low confidence cells, until a combination is found that produces a page with so few errors that the errors can be corrected through other means, such as with an ECC process. As described for the process of FIG. 7, the number of cells to change in this manner before attempting verification may vary. In some embodiments, the preferred number of cells to change may depend on various factors, such as but not limited to: 1) which correction technique is being used, 2) the number of cells contained in the failed address range, 3) etc.

Verification

Verification corresponds with operation 330 of FIG. 3. Verification of the data in the page may be performed through any feasible manner, such as but not limited to processing the page of binary data through an ECC process that will correct the remaining errors, provided the quantify of errors is not beyond the ability of the ECC to correct. If the corrected data is verified in this manner, the corrected data may be written to a storage location where it can be used. This would presumably not be to the same page in the same erase block in which it originally failed, since defects in that physical storage location may have caused the errors in the first place. On the other hand, if the new page of data still has uncorrectable errors, various procedures may be followed, such as but not limited to one or more of: 1) assume the data in the page is lost, and discard the data, 2) re-run the previous operations on the new or original data, but use different parameters to correct the data, 3) re-run the previous operations on different low confidence cells, 4) run different detection operations to determine the low confidence cells, 5) etc.

In some embodiments these operations may be performed within the controller of the NV memory (e.g., by the error analysis unit 144 of FIG. 1). In other embodiments these operations may be performed external to the NV memory (e.g., by one or more main processors in the computer system). In still other embodiments these operations may be performed by multiple such devices (e.g., some operations in the NV memory controller, some operations by the main processor(s). These are only a few of the ways in which the operations may be performed.

The foregoing description is intended to be illustrative and not limiting. Variations will occur to those of skill in the art. Those variations are intended to be included in the various embodiments of the invention, which are limited only by the scope of the following claims.

What is claimed is:

1. A method, comprising:
   determining that binary data read from a specified range of sequential memory locations in a charge-based non-volatile (NV) memory contains errors that were uncorrected by an error correcting code (ECC) unit associated with the NV memory;

identifying which memory cells in the specified range produced data that is likely to be in error, said identifying to include
incrementing a read reference voltage through a range of voltage values,
reading, for each increment, binary data from within the specified range of sequential memory locations,
identifying which memory cells produce different binary data in a current increment than for a previous increment to determine analog charge values for the memory cells that produced different binary data, and
restoring the incremented read reference voltage and comparing the restored incremented read reference voltage to the analog charge values for the memory cells that produced different binary data to identify which memory cells in the specified range produced data that is likely to be in error;
changing the data for at least some of the memory cells whose data was determined to likely be in error; and
verifying whether the changed data is sufficiently correct for the ECC unit to provide correct data for the specified range.

2. The method of claim 1, wherein said identifying further comprises:
producing a map of charge level values for the memory cells in at least the specified range; and
comparing the charge level values in groups of memory cells in the map to predefined patterns of charge levels, to identify which of the memory cells produced binary data likely to be in error.

3. The method of claim 1, wherein said identifying further comprises:
determining analog charge values for memory cells in the specified range; and
determining which memory cells in the specified range have an analog charge value within a predetermined voltage amount of a read reference voltage for the NV memory.

4. The method of claim 1, wherein said changing comprises adjusting analog charge values for the memory cells identified as likely to be in error.

5. The method of claim 1, wherein said changing comprises substituting random binary data for the data from the memory cells identified as likely to be in error.

6. The method of claim 1, wherein the specified range of sequential memory locations is a page of memory.

7. An apparatus, comprising
a computer system containing a processor and a charge-based non-volatile (NV) memory, the computer system to perform:
determining that binary data read from a specified range of sequential memory locations in the NV memory contains errors that were uncorrected by an error correcting code (ECC) unit associated with the NV memory;
identifying which memory cells in the specified range produced data that is likely to be in error, said identifying to include
incrementing a read reference voltage through a range of voltage values,
reading, for each increment, binary data from within the specified range of sequential memory locations,
identifying which memory cells produce different binary data in a current increment than for a previous increment to determine analog charge values for the memory cells that produced different binary data, and
restoring the incremented read reference voltage and comparing the restored incremented read reference voltage to the analog charge values for the memory cells that produced different binary data to identify which memory cells in the specified range produced data that is likely to be in error;
changing the data for at least some of the memory cells whose data was determined to likely be in error; and
verifying whether the changed data is sufficiently correct for the ECC unit to provide correct data for the specified range.

8. The apparatus of claim 7, wherein said identifying further comprises:
producing a map of charge level values for the memory cells in at least the specified range; and
comparing the charge level values in groups of memory cells in the map to predefined patterns of charge levels, to identify which of the memory cells produced binary data likely to be in error.

9. The apparatus of claim 7, wherein said identifying further comprises:
determining analog charge values for memory cells in the specified range; and
determining which memory cells in the specified range have an analog charge value within a predetermined voltage amount of a read reference voltage for the NV memory.

10. The apparatus of claim 7, wherein said changing comprises adjusting analog charge values for the memory cells identified as likely to be in error.

11. The apparatus of claim 7, wherein said changing comprises substituting random binary data for the data from the memory cells identified as likely to be in error.

12. An article comprising
a tangible computer-readable medium that contains instructions, which when executed by one or more processors result in performing operations comprising:
determining that binary data read from a specified range of sequential memory locations in a charge-based non-volatile (NV) memory contains errors that were uncorrected by an error correcting code (ECC) unit associated with the NV memory;
identifying which memory cells in the specified range produced data that is likely to be in error, said identifying to include
incrementing a read reference voltage through a range of voltage values,
reading, for each increment, binary data from within the specified range of sequential memory locations,
identifying which memory cells produce different binary data in a current increment than for a previous increment to determine analog charge values for the memory cells that produced different binary data, and
restoring the incremented read reference voltage and comparing the restored incremented read reference voltage to the analog charge values for the memory cells that produced different binary data to identify which memory cells in the specified range produced data that is likely to be in error;
changing the data for at least some of the memory cells whose data was determined to likely be in error; and
verifying whether the changed data is sufficiently correct for the ECC unit to provide correct data for the specified range.

13. The article of claim 12, wherein the operation of identifying further comprises:

producing a map of charge level values for the memory cells in at least the specified range; and comparing the charge level values in groups of memory cells in the map to predefined patterns of charge levels, to identify which of the memory cells produced binary data likely to be in error.

14. The article of claim 12, wherein the operation of identifying further comprises:

determining analog charge values for memory cells in the specified range; and determining which memory cells in the specified range have an analog charge value within a predetermined voltage amount of a read reference voltage for the NV memory.

15. The article of claim 12, wherein the operation of changing comprises adjusting analog charge values for the memory cells identified as likely to be in error.

16. The article of claim 12, wherein the operation of changing comprises substituting random binary data for the data from the memory cells identified as likely to be in error.

17. The article of claim 12, wherein the specified range of sequential memory locations is a page of memory.

* * * * *